(12) United States Patent
Hall et al.

(10) Patent No.: US 7,729,115 B2
(45) Date of Patent: Jun. 1, 2010

(54) ELECTRICAL APPARATUS AND COOLING SYSTEM

(75) Inventors: Terence Martyn Hall, Chelmsford (GB); Tony Glen Collins, Chelmsford (GB); Stephen William Hurrell, Chelmsford (GB); Stephen John Norrington, Chelmsford (GB); Andrew Murray Wood, Chelmsford (GB)

(73) Assignee: E2V Technologies (UK) Limited, Chelmsford, Essex (GB)

( * ) Notice: Subject to any disclaimer, the term of this patent is extended or adjusted under 35 U.S.C. 154(b) by 451 days.

(21) Appl. No.: 10/589,627

(22) PCT Filed: Feb. 16, 2005

(86) PCT No.: PCT/GB2005/000571

§ 371 (c)(1), (2), (4) Date: Jun. 26, 2007

(87) PCT Pub. No.: WO2005/081401

PCT Pub. Date: Sep. 1, 2005

(65) Prior Publication Data

US 2008/0030951 A1 Feb. 7, 2008

(30) Foreign Application Priority Data

Feb. 16, 2004 (GB) .................................. 0403382.5

(51) Int. Cl.
*H05K 7/20* (2006.01)
*F28F 7/00* (2006.01)
*H05K 5/00* (2006.01)
*A47B 77/08* (2006.01)

(52) U.S. Cl. ............... 361/695; 361/679.5; 361/679.49; 361/694; 361/697; 361/701; 165/80.2; 165/8.3; 165/185; 454/184; 312/236

(58) Field of Classification Search .............. 361/679.5, 361/679.49, 694, 695, 697; 165/80.2–80.3, 165/185; 454/184; 312/236
See application file for complete search history.

(56) References Cited

U.S. PATENT DOCUMENTS 4,525,769 A 6/1985 Lehmann et al.
(Continued)

FOREIGN PATENT DOCUMENTS

EP 1 061 788 A2 12/2000
(Continued)

OTHER PUBLICATIONS

United Kingdom Search Report for GB0403382.5 dated Jun. 8, 2004.
International Search Report for PCT/GB2005/000571 dated Aug. 3, 2005.

*Primary Examiner*—Zachary M Pape
(74) *Attorney, Agent, or Firm*—Venable LLP; Robert Kinberg; Leigh D. Thelen

(57) ABSTRACT

An electrical apparatus having a cooling system includes a first cover to cover a first part of the electrical apparatus to be cooled and a second cover substantially enclosing the first cover to define a surrounding space. A base plate on which the first cover is mounted defines an environmentally-sealed enclosure that houses the first part of electrical apparatus. A first circulation device causes air to circulate in the environmentally-sealed enclosure and a second circulation device causes a cooling fluid to circulate around the surrounding space. A heat transfer structure is positioned on each side of the first cover. A third cover is mounted to an opposite side of the base plate from the first cover to define a second enclosure that houses a second part of the electrical apparatus to be cooled. A heat exchange structure is positioned within the second enclosure. The second circulation device is arranged to drive cooling fluid both through the heat exchange structure and through the surrounding space.

24 Claims, 8 Drawing Sheets

U.S. PATENT DOCUMENTS

| | | | |
|---|---|---|---|
| 4,807,441 | A | 2/1989 | Agee et al. |
| 5,894,407 | A | 4/1999 | Aakalu et al. |
| 6,082,441 | A | 7/2000 | Boehmer et al. |
| 6,149,254 | A | 11/2000 | Bretschneider et al. |
| 6,877,551 | B2 * | 4/2005 | Stoller .................. 165/47 |
| 2001/0052412 | A1 * | 12/2001 | Tikka .................. 165/299 |
| 2004/0007347 | A1 | 1/2004 | Stoller |

FOREIGN PATENT DOCUMENTS

| | | |
|---|---|---|
| FR | 1393510 A | 2/1965 |
| GB | 2 284 659 A | 6/1995 |

* cited by examiner

ELECTRICAL APPARATUS AND COOLING SYSTEM

The present invention relates to an electrical apparatus having a cooling system, and in particular, to a high power amplifier having a cooling system, such as those used in satellite uplink applications.

High Power Amplifiers (HPAs) are used at satellite communications ground terminals, for example, to boost the signal on the satellite uplink to the level required for transmission through the atmosphere. A typical HPA employs a Travelling Wave Tube (TWT) to amplify the signal received at a Radio Frequency (RF) input. The gain of the TWT can be as much as 400,000, meaning that a 1 mW signal received at the input can be output with a power of about 400 W. During amplification, the TWT consumes about 1100 W of power, with much of this, approximately 800 W, being dissipated as heat. Heat is also generated by the electronic circuits which control the HPA, and can amount to a further 300 W.

The electronics components used in the HPA require operating temperatures to be kept below about 35° C. greater than ambient for reliable operation. This can be especially difficult considering the outdoor location of most satellite ground stations, where sunlight can add to the heating effect by as much as 30 W, in addition to the large amount of heat produced by the HPA itself during operation. There is therefore a need for an effective and efficient cooling system to prevent operating temperatures from rising to a level where the HPA cannot function or where it is permanently damaged.

Formerly, known cooling systems for HPAs have removed heat by forced air cooling of a heat sink mounted to a single enclosure surface, and natural conduction/convection from the remaining surfaces.

U.S. Pat. No. 4,807,441 in the name of Allied-Signal Inc, discloses a general purpose cooling system for cooling a sealed enclosure in which heat generating equipment is housed. The cooling system or heat exchanger is mounted to the wall of the sealed enclosure and includes two side plates which are mounted a spaced distance from one another. One side plate forms a portion of a wall of the sealed enclosure and has fin elements mounted on the side which is outside of the enclosure. Fin elements are mounted between the two side plates extending inwardly a desired distance from opposing ends of the side plates thereby forming a central plenum between the two fin elements. A fan is mounted in a manner to draw air in between the side plates and return it to the closed environment.

Such cooling systems have been found insufficient in cooling HPAs of the type mentioned above, and we have therefore appreciated that there is a need for an improved cooling system.

The invention is defined in the independent claims to which reference should now be made. Advantageous features are set out in the dependent claims.

A preferred embodiment of the invention will now be described in more detail, by way of example, and with reference to the drawings in which.

The high power amplifier according to the present invention is designed to be suitable for satellite applications, and may therefore be installed at a satellite ground terminal, or on the roof of a mobile communications van. It is also suitable for application in terrestrial microwave links, such as in line-of-sight terrestrial microwave links.

Figure 1:
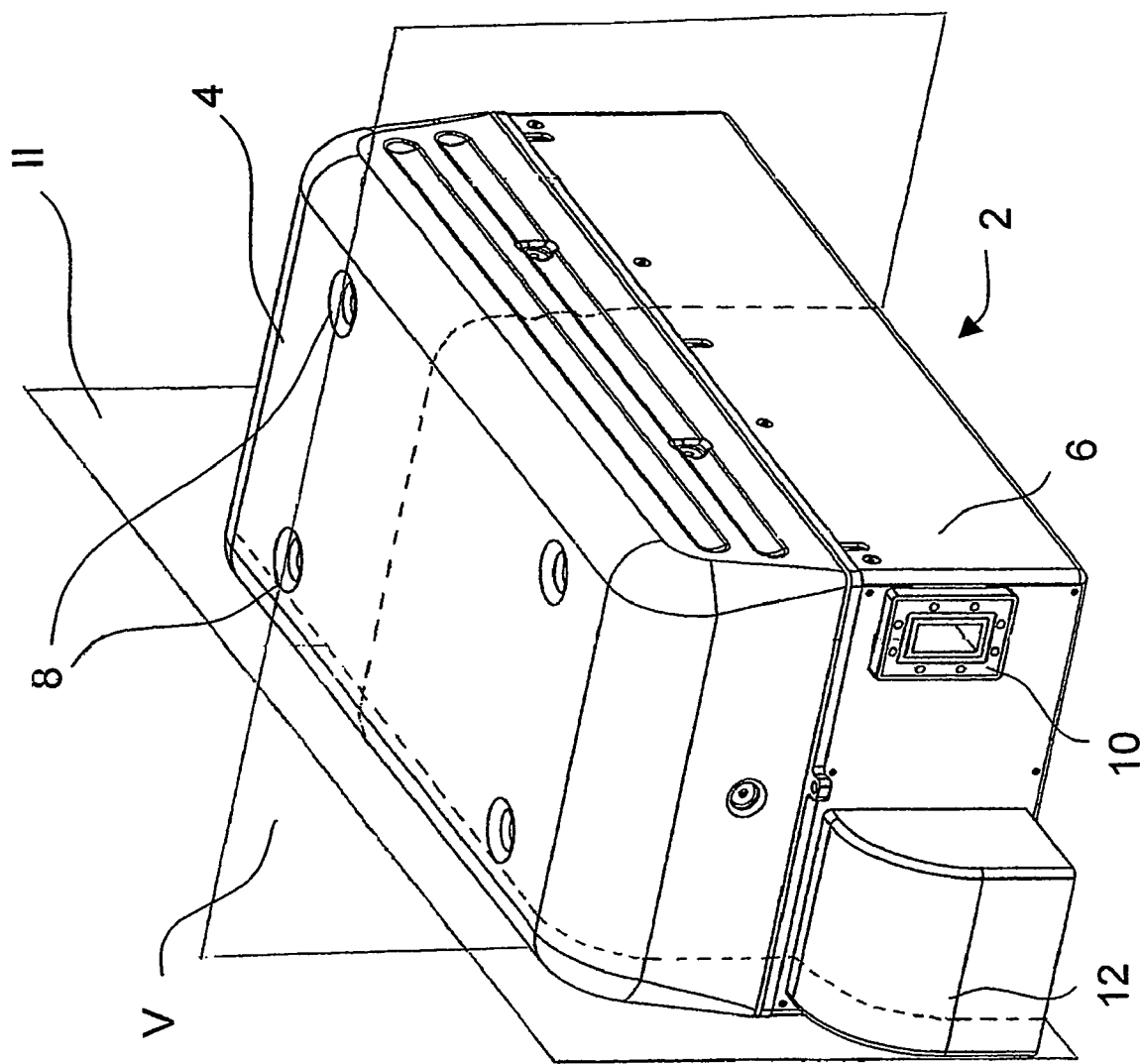
FIG. 1 is a perspective view of a high power amplifier according to the preferred embodiment of the invention.

A high power amplifier according to preferred embodiment of the invention as shown in FIG. 1 to which reference should now be made. The high power amplifier 2 comprises an outer cover 4 mounted on base housing 6 and secured in place by a number of screws 8. The base housing 6 has a radio frequency (RF) output 10 and an air inlet cover 12 positioned on its side.

Preferably, the outer cover is made of a plastics material so that it is resistant to heating by the sun. The colour of the outer cover 4 is chosen accordingly to reflect a large proportion of the sun's incident radiation. The base housing is preferably made of metal, for durability and to shield the electronics of the HPA from external electrical influences.

Figure 2:
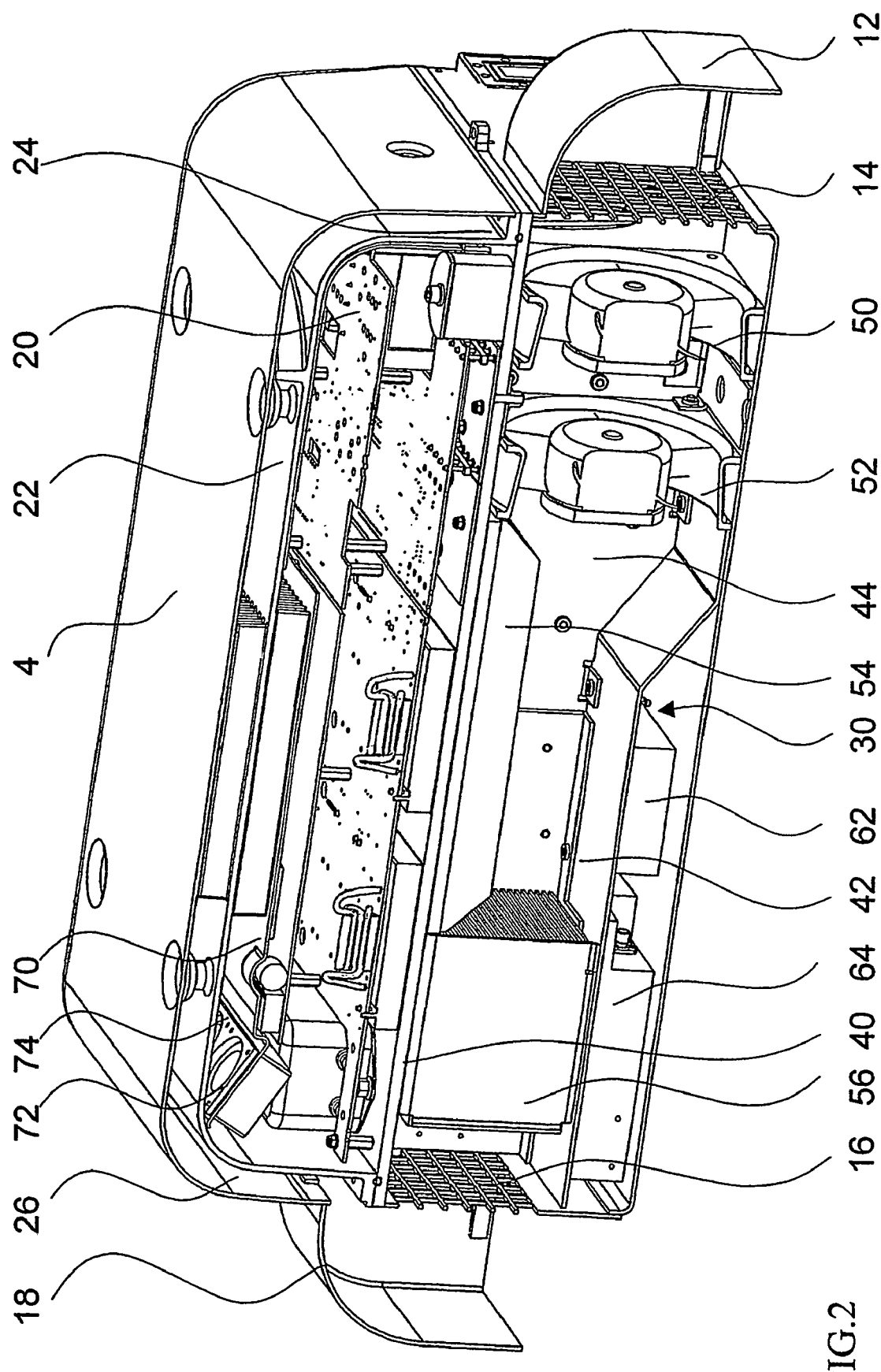
FIG. 2 is a longitudinal cross section of the high power amplifier shown in FIG. 1, along plane II.

FIG. 2 shows a cross-section through the high power amplifier shown in FIG. 1. The plane of cross section is illustrated in FIG. 1 by the numeral II. Referring to FIG. 2, the high power amplifier can further be seen to comprise of electronics enclosure 20 and RF enclosure 30, separated by base plate 40. The thickness of base plate 40 in the preferred embodiment is approximately 6 mm.

Figure 8:
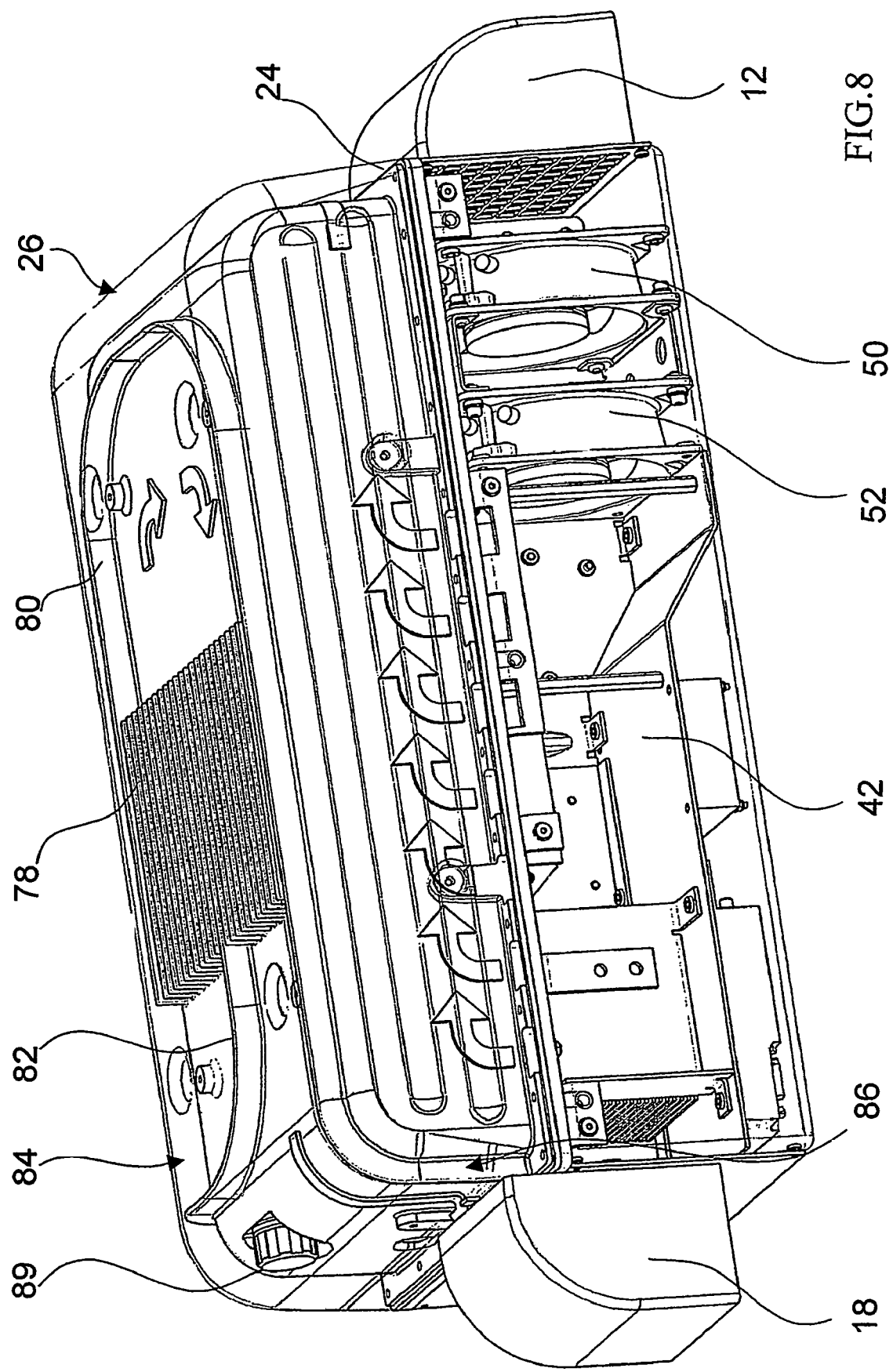
FIG. 8 is a perspective view of the high power amplifier shown in FIG. 1, indicating flow of the cooling fluid underneath the outermost casing.

The electronics enclosure 20 is defined between the base plate 40 and enclosure cover 22, which is secured to the base plate by a number of screws. Referring momentarily to FIG. 8, it will be appreciated that the enclosure cover 22 is provided with a flange 24 which mates with the base plate and compresses an o-ring gasket, disposed in the base plate, to form an environmental seal. The flange 24 also allows the enclosure cover 22 to be set back or spaced slightly from the outer cover 4. An enclosed or surrounding space 26 is therefore created around the electronics enclosure by the outer cover, as can be partially seen in FIG. 2, through which a cooling flow of air can be made to circulate.

It will be appreciated with reference to FIGS. 2 and 8 that both of the outer cover 4, and the enclosure cover 22 have generally the same shape, that of a cuboid with smoothed or rounded corners. This facilitates a smooth flow of air around the enclosed space, avoiding dead zones, and other disruptions in the flow.

The electronics enclosure 20 contains the Electronic Power Conditioning (EPC) circuits 28 that condition the prime power input supply and generate all the supplies required for correct operation of the Travelling Wave Tube (TWT) and ancillary circuits, such as RF assemblies, cooling and control assemblies. The electronics enclosure also includes the control unit, which is a microprocessor based system providing a user interface and performing all the internal housekeeping functions of the high power amplifier. The electronics enclosure is environmentally sealed to protect the components against the typically harsh environmental conditions encountered in the field. The enclosure cover is preferably of a metal construction so that the electronics housed within are electrically shielded from external signals. Aluminium is preferred because of its cost, strength, weight and porosity. The metal cover also provides means for transferring heat between the electronics enclosure 20 and the surrounding space 26.

Figure 3:
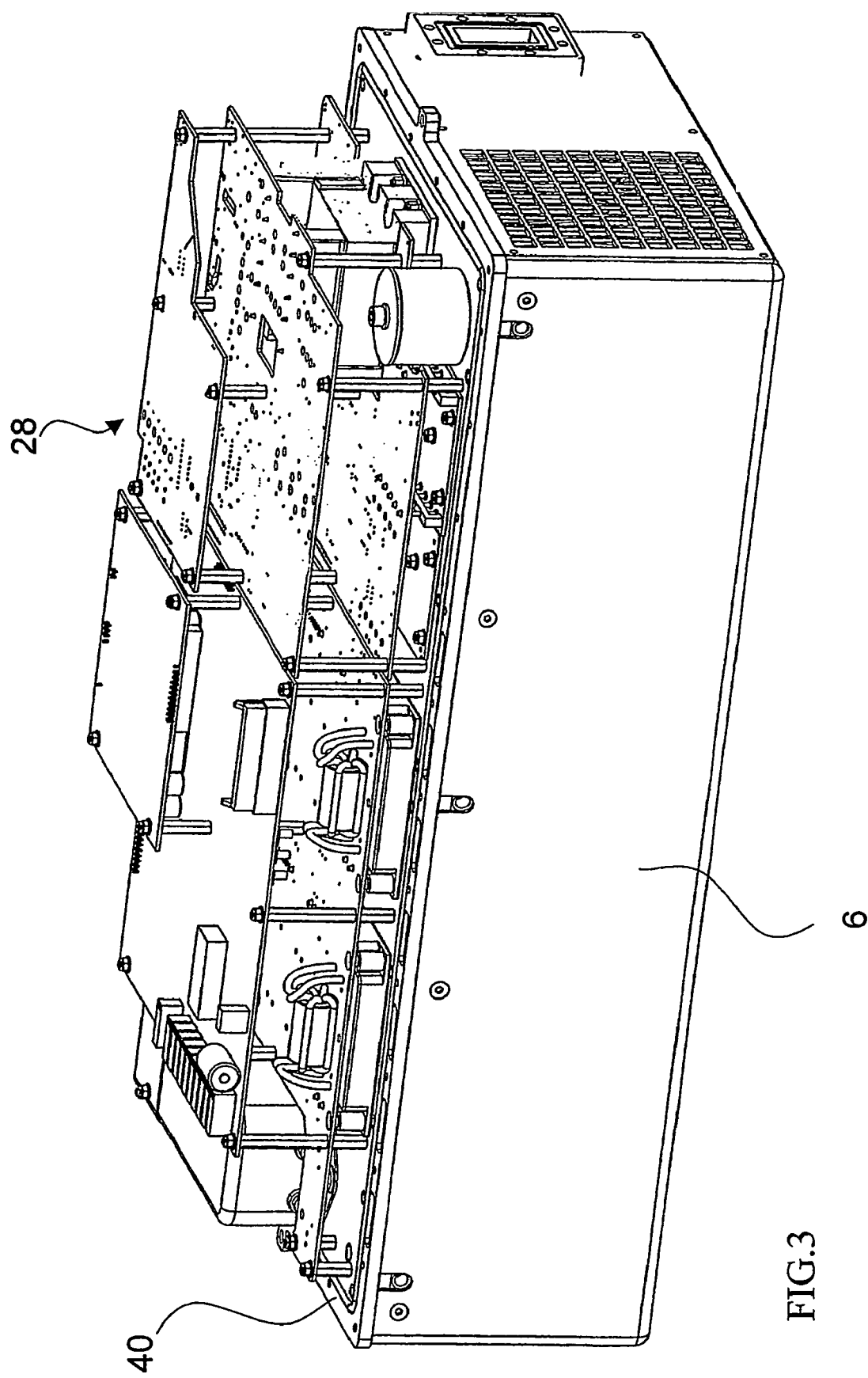
FIG. 3 is a perspective view of the high power amplifier shown in FIG. 1, with the top two covers removed and the electronics enclosure exposed.

The structure of the electronics components are shown in more detail in FIG. 3, with the enclosure cover 22 removed. A discussion of the operation of the electronics within the enclosure is not however given as it is not necessary to understand the invention.

Considerable heat is generated by the electronics which are generally irregularly shaped electronic PCB mounted components. Many of these are at high voltages, reaching 10 kV for example, and direct contact methods of cooling are not therefore possible. The electronics enclosure therefore comprises a secondary cooling system, separate from the main cooling system, which causes circulating cooling air to flow over the electronics components. This will be described in more detail later.

The RF enclosure 30 includes the necessary circuitry and hardware for amplification of the radio signal, as well as the principal components of the cooling system. It will now be described in more detail, with reference to FIGS. 2 and 4.

As shown in FIG. 2, the RF enclosure 22 is defined between the base plate 40 and the side walls of the base housing 6. The base housing is divided into two compartments by raised floor portion 42, and a divider wall 44, forming a partition. Part of the cooling system is housed in one of the compartments, shown in FIG. 2 as the nearest, while the amplifying apparatus including the TWT is housed in the other. The angle at which the HPA is shown in FIG. 2 means that the amplifying apparatus is mostly obscured by the cooling system.

The part of the cooling system housed in the RF enclosure 30 will now be described in more detail and with reference to FIG. 2. The base housing has an air inlet 14 covered by air inlet cover 12. Disposed behind air inlet 14 are first and second cooling fans 50 and 52 arranged co-axially with each other and the air inlet 14. Disposed behind the second cooling fan 52, mounted on the underside of base plate 40, is first heat exchange structure 54. The heat exchange structure 54 comprises a number of straight parallel ridges extending longitudinally along the base plate and substantially co-axially to the cooling fans 50, 52 and air inlet 14. The ridges have a height of approximately 10 mm to 15 mm and a length of approximately half of the length of the base plate. Furthermore, the ends of the ridges are tapered so that each ridge has an approximately trapezoidal cross-section. The heat exchange structure 54 is positioned, longitudinally speaking, in the approximate centre of the base plate 40. Heat exchange structure 54 is shown from a different angle, revealing more detail, in FIG. 7 to which reference should briefly be made.

On the opposite side of the RF enclosure 30 to the air inlet 14 is air exhaust 16. This is similarly concealed under air exhaust cover 18 mounted on the exterior of the base housing 6. Situated between air exhaust 16 and heat exchange structure 54 is second heat exchange structure 56. Unlike the first heat exchange structure 54, the second heat exchange structure 56 occupies the entire height of the RF enclosure between base plate 40 and raised floor plate 42. Second heat exchange structure 56 comprises an array of vertically orientated vanes or fins. Air is able to enter the second heat exchange structure through gaps in the vanes or fins in the face directed towards the inlet 14, and leave through gaps in the fate directed towards the air exhaust 16.

Figure 7:
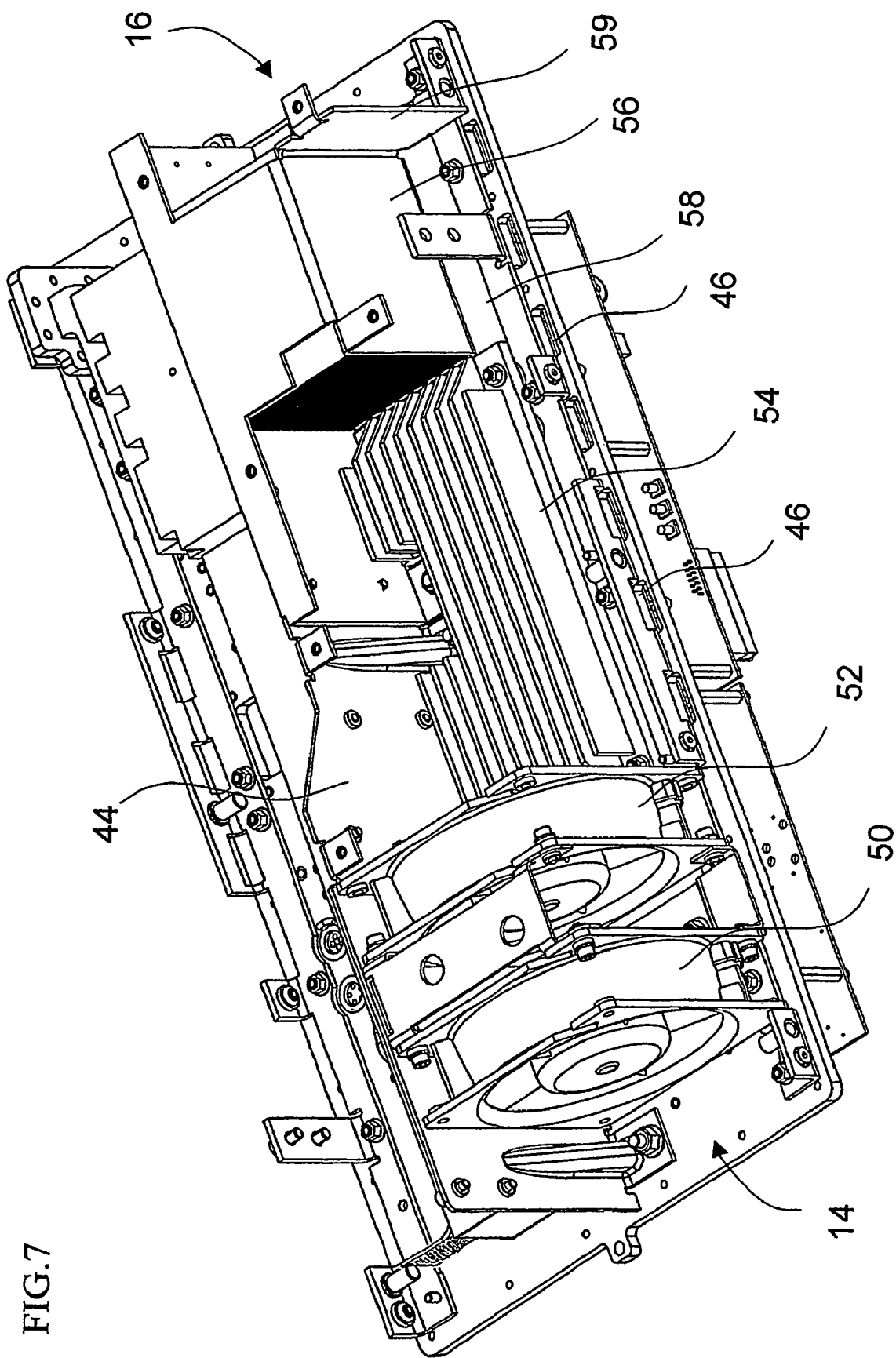
FIG. 7 is a bottom perspective view of the high power amplifier with the outer casing removed, showing a section of the cooling system in more detail.

The raised floor plate 42 and the divider plate 44, shown more clearly in FIG. 7, define a main fluid flow path for the air in the RF enclosure. Thus, air drawn into the inlet 14 by cooling fans 50 and 52 is caused to pass over the first and second heat exchange structures 54 and 56 before exiting via the exhaust 16.

As can be seen from FIG. 7, the second heat structure 56 is arranged not to take up the entire width of the main fluid flow channel. In doing so, the weight of the second heat exchange structure can be reduced while still giving a similar cooling effect to a larger structure.

Preferably, therefore, a recess 58 is provided between the side of the second heat structure and the side of the base housing. This recess is terminated by end plate 59 thus causing a dead-end or blockage in part of the channel. The base plate 40 comprises a number of slots or apertures 46 disposed along the edge of the base plate between the cooling fans 50 and 52 and the end plate 59. The slots 46 allow some of the air in the channel to escape through the base plates and into the enclosed space 26 between the inner and outer cover where it is used to cool the rest the high power amplifier. This will be described in more detail later.

The construction of the amplifier will now be described briefly with respect to FIG. 4, which shows a perspective view of the RF enclosure 30, taken from the underside and rear of the high power amplifier as it is shown in FIG. 2, with the base housing 6 removed. The main amplifying device of the HPA is the TWT 60. This is essentially a thermionic valve employing vacuum electron tube technology. The TWT receives an input from an RF input stage 62 and 64 and feeds an amplified output to an RF output stage 10. As mentioned earlier, the gain of the amplification can be as much as 400,000 and result in about 800 W of heat being dissipated.

Figure 4:
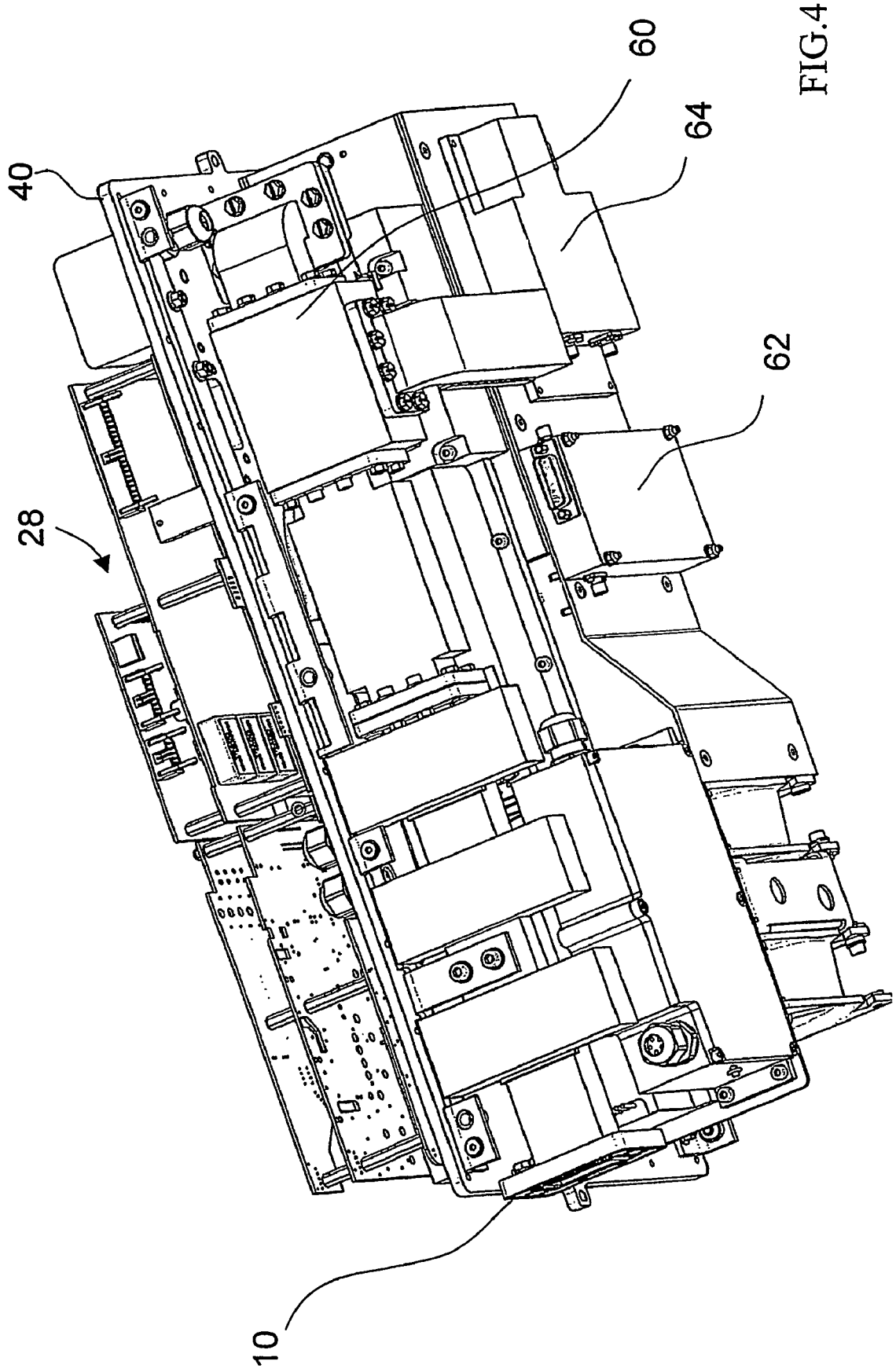
FIG. 4 is a rear perspective view of the high power amplifier showing detail of sections of the electronics enclosure and amplification components, mounted on the base plate.

In FIG. 4, the electronics enclosure 22 is shown mounted on the upper side of base plate 40 with the cover removed.

Having described the overall structure of the electronics enclosure 20 and the RF enclosure 30, the discussion of the secondary cooling system within the electronics enclosure will now be returned to and described in more detail with reference to FIG. 2.

Depending from the inside of enclosure cover 22 is inner cover or guide surface 70. Preferably the inner cover or guide surface 70 is a plastic moulding secured to the inside of the enclosure cover by a number of screws 71 (see FIG. 6).

The inner cover or guide surface has a substantially flat surface extending parallel to the underside of the top of the enclosure cover and parallel to the circuit boards in the electronics enclosure below. An angled section of the inner cover extends from the flat surface to the interior edge of the enclosure cover top surface at its shorter side, and provides a location at which stirrer fans 72 and 74 are mounted. In FIG. 2, the stirrer fans 72 and 74 can be seen located in the corner of the electronics enclosure and angled such that the axis of the fan is tilted at about 20° to the vertical. The inner cover or guide surface 70 extends underneath the enclosure cover for approximately half the length of the electronics enclosure, leaving the region within the electronics enclosure uncovered at the end opposite to that at which the stirrer fans are disposed.

Figure 5:
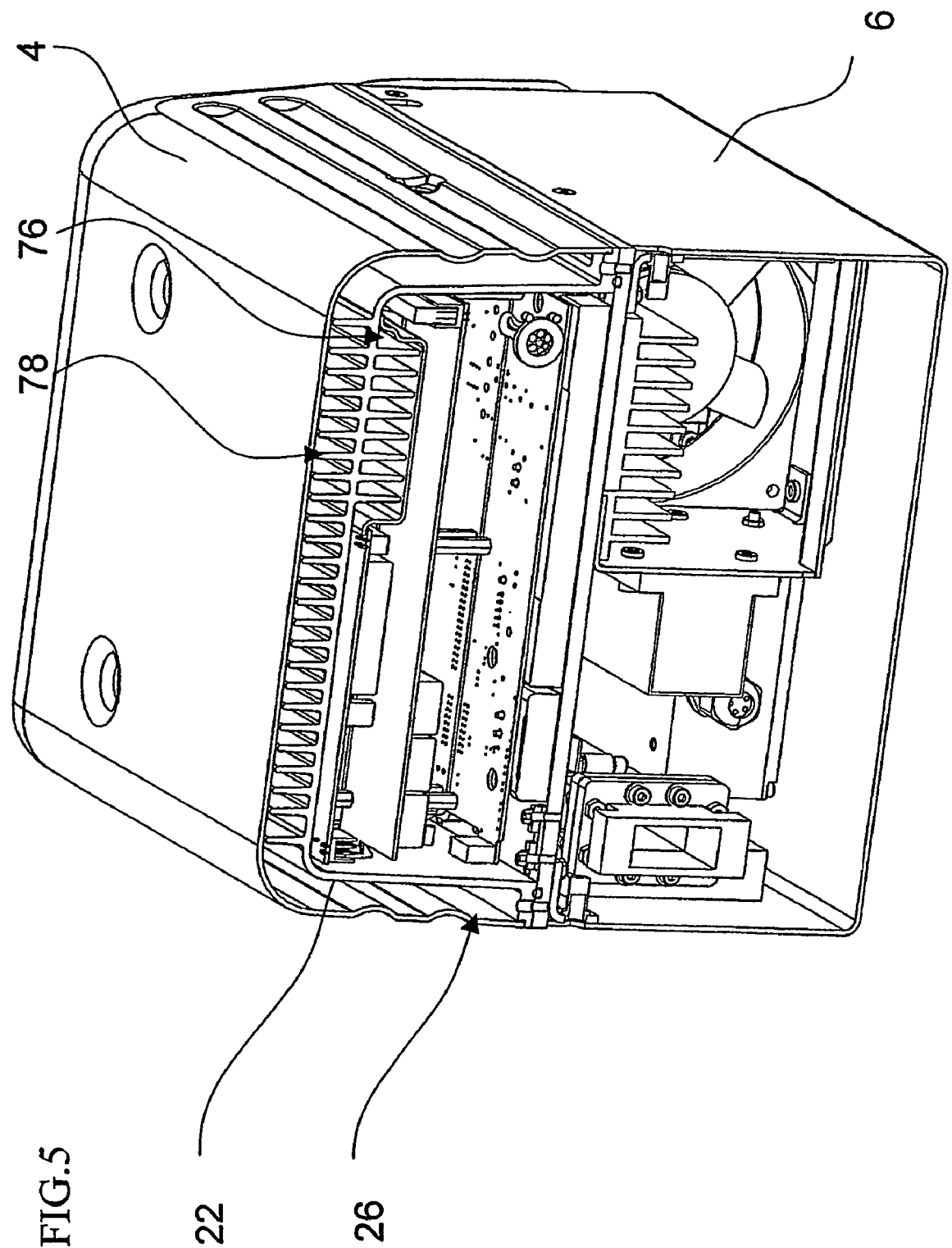
FIG. 5 is a lateral cross section through the high power amplifier shown in FIG. 1, along plane V.

Referring to FIG. 5 which shows a lateral cross-section of the high power, amplifier, the plane of cross section being indicated in FIG. 1 by the Roman numeral V, it can be seen that enclosure cover 22 comprises heat transfer means for transferring heat between the enclosure cover and the surrounding space 26. These means comprise an internal and an external array of heat exchange fins 76 and 78 respectively. The fins may be formed integrally with the enclosure cover or may be bonded or otherwise attached to the enclosure cover during or after manufacture. The heat exchange fins are arranged so that they occupy opposing areas on opposite sides of the enclosure cover, that is to say they are located partially in correspondence with each other and in part occupy substantially overlapping areas.

In FIG. 5, opposing fins are shown in exact lateral correspondence with each other, although this need not necessarily be the case. The heat exchange fins of both the internal and external heat exchange structures extend longitudinally with respect to the enclosure cover 22. As can be seen from FIG. 5, the internally protruding array of heat exchange fins 76 extend between the enclosure cover 22 and the opposing surface of the inner cover, such that they are sandwiched in-between.

Figure 6:
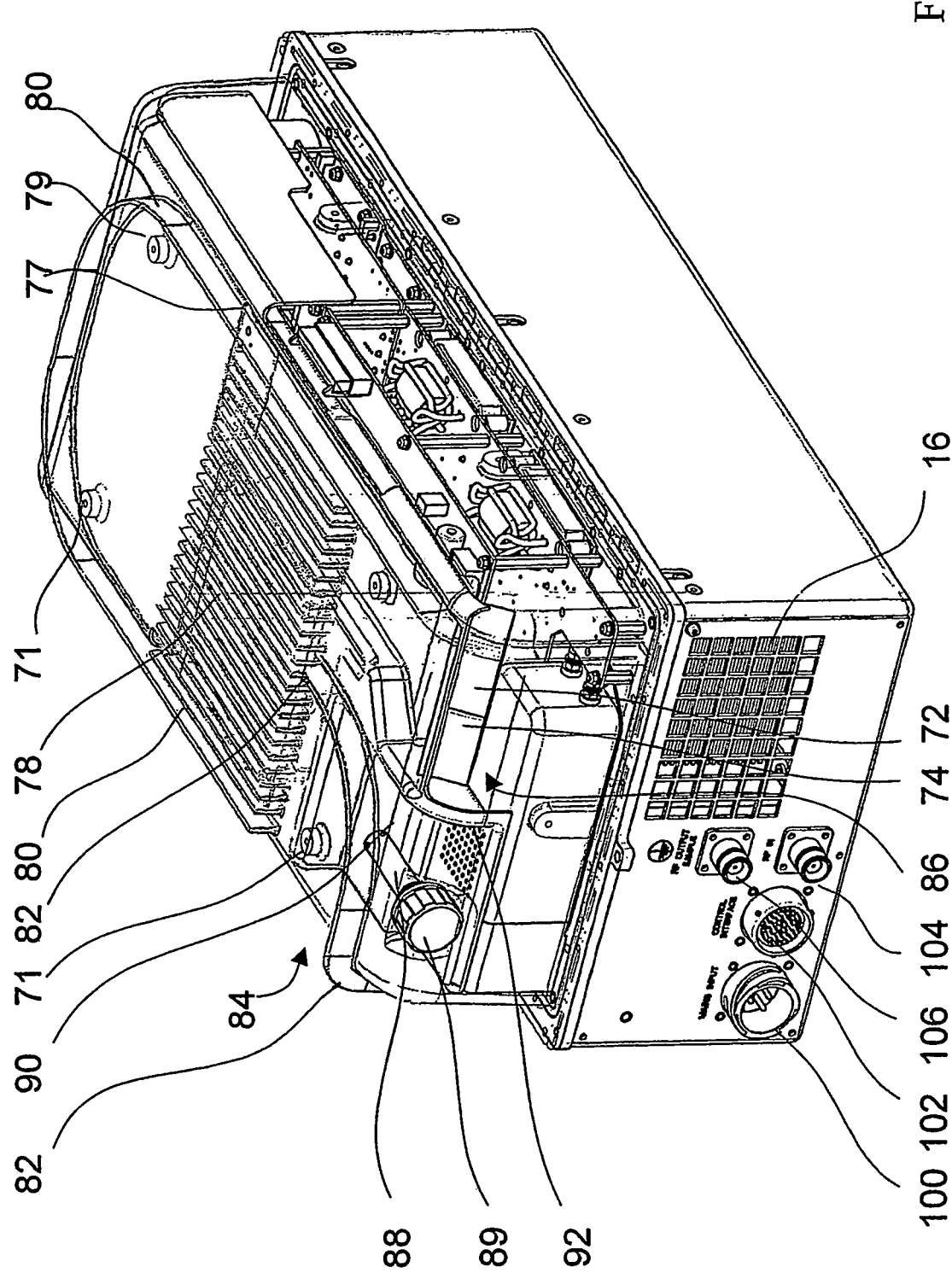
FIG. 6 is a perspective view of the high power amplifier shown in FIG. 1, illustrating in more detail the construction of the inner cover.

More of the detail of the internal cooling system can be seen with reference to FIG. 6, which shows the high power amplifier in a perspective view, with the outer casing removed, and the detail of the enclosure cover surface shown transparently, so as not to obscure any features underneath.

The top of stirrer fans 72 and 74 can be seen at the near corner underneath the enclosure cover, as can the inner cover or guide surface 70. As can be appreciated from FIGS. 5 and 6 the inner cover or guide surface 70 extends over a portion of the width of the electronics enclosure, in the longitudinal direction. It does not extend over the entire width of the enclosure to allow for part of the electronics to be accommodated, as can be seen from FIG. 5. Assuming the electronics can be accommodated under the inner cover 70, it may be preferable if the internal heat exchange fins and inner cover extend over the entire width of the enclosure so that the flow of circulating air can be maximised. Two or more stirrer fans may be provided in such a case to circulate the air. In the preferred embodiment, the inner cover breaks to allow the particular electronics to be accommodated, as this allows the electronics enclosure, and thus the whole apparatus to be more compact.

Referring again to FIG. 6, a cut-out portion 77 in a support plate 79 adjoining the inner cover 70 provides an outlet for the air circulated by the stirrer fans 72 and 74 to descend from the inner cover onto the electronic circuits below. The support plate may be formed integrally with the inner cover 70, and allows the inner cover 70 to be more securely joined to the inside of electronic cover 22, as well as providing insulation between the enclosure cover 22 and the high voltage assemblies underneath. The support plate 79 is preferably also joined to the inside of the enclosure cover by screws 71.

The external detail of the enclosure cover 22 will now be described with reference to FIG. 6. In addition to the heat exchange fins 78, the upper surface of enclosure cover 22 bears a peripheral ridge 80, encompassing three the edges of the enclosure cover top surface, and a central ridge 82. The central ridge 82 curves from a corner of the top surface of the enclosure cover to extend in a substantially parallel fashion intermediate two of the opposing sides of the peripheral ridge, towards the third side. The central ridge 82 terminates before it reaches the third side, such that the peripheral ridge 80 and the central ridge 82 define between them a path that resembles the letter U. Half of the array of heat exchange fins 78 lie in the branch corresponding to one side of the U-shaped path, and half lie in the branch corresponding to the other side of the U-shaped path. Furthermore, the peripheral ridge 80 and the central ridge 82 are of such a height as to cooperate with the interior of outer cover 4 such that the U-shaped path is closed apart from an inlet 84 and an outlet 86 at either end. Thus, a fluid flow path is defined for carrying a cooling fluid through a portion of the heat exchange fins 78 in one direction and then through an adjacent section of the heat exchange fins in the opposite direction.

Referring now to FIG. 2, it will be appreciated that air outlet 86 is positioned above air exhaust 16 so that the air from both of these outlets can be vented at the same location and directed away by air exhaust cover 18.

Breather tube 88 is mounted in the shoulder of enclosure cover 22 and is sealed by screw cap 89. Breather tube 88 communicates with the interior of a chamber 90, defined inside the enclosure cover by chamber wall 92. The chamber 90 contains desiccant material for removing moisture from the air in the electronics enclosure. Located behind the mouth of the breather tube, in the corner of the chamber, are a series of openings, which allow the air in the chamber to communicate with the electronics enclosure 20. It will be appreciated that the inner cover, the supporting plate, and the chamber wall, could be formed integrally with each other or formed separately, and then joined or bonded together.

FIG. 6 also shows the base housing 6 from the opposite direction to that of FIG. 1. Air exhaust 16 can be seen more clearly, as well as a prime power connection 100, a control interface connection 102, and feeds for RF input 104 and RF output sample port 106. The sample port connector receives from the internal circuitry of the HPA a 'sample' of the RF output at approximately $1/100,000^{th}$ of the output power. These connections allow communication with and control of the high power amplifier and allow the high power amplifier to be operated remotely.

Having described the overall structure of the preferred high power amplifier and cooling system, the operation of the cooling system will now be described in more detail with reference to FIGS. 7 and 8. The cooling system of the high power amplifier utilises three separate flows of air in order to cool the electronics and other components.

The main flow of air is created by the high performance axial fans 50 and 52, which draw air into the RF enclosure 30 by means of air inlet 14, and expel it via air exhaust 16. In passing from the air inlet to the exhaust, the air passes in a straight path through the main fluid flow channel, over the fins of the first heat exchange structure 54, and through the fins of the second heat exchange structure 56. As is known in the art, the fins of the first and second heat exchange structures 54 and 56 provide a large surface area in contact with the flow of air, and as air is drawn over the fins, heat is lost from them, and therefore, the components to which they are connected. First heat exchange structure 54 is attached to the underside of base plate 40, underneath the Electric Power Circuits 28 so that they are cooled, and second heat exchange structure 56 is attached to a plate on the side of the TWT so that the TWT is cooled.

The provision of the second heat exchange structure 56 and the terminating plate 59 to cause a blockage or restriction in the path of the flow of air, causes an area of high pressure to form between the inlet fans and the exhaust 16. The effect of the high pressure is to actively divert some of the airflow through slots 46 into the space 26 defined between the enclosure cover 22 and the outer cover 4. This is shown in FIG. 8 by the arrows which represent air flow and illustrate the second flow of air in the cooling system.

It will be appreciated that the preferred system therefore provides means for ducting the air from the main flow of air, through the surrounding space between the electronics and the outer cover. The ducting effect is enhanced by the alignment of the air exhaust 16 and the outlet 86 from the surrounding space, so that once the air has entered the surrounding space it is at least partly drawn towards the outlet 86 by a difference in pressure.

Having entered the surrounding space, the air is constrained to flow in a path defined by the peripheral ridge 80 mounted on the enclosure cover. This cooperates with the interior of the outer casing 4 to define an airflow path around three of the sides of the enclosure cover before the air reaches the air inlet 84 on the top of the enclosure cover. The air is first forced to flow along the long side of the enclosure cover, by which the slots are disposed, then along the shorter end face of the enclosure cover above the air inlet and then along the second longer side of the enclosure cover before it is forced up to air inlet 84. Having reached air inlet 84, the air is forced by central ridge 82 to flow through the first branch of the U-shaped path containing a first section of the heat exchange fins 76. Having passed through these, the air is then forced to return in the opposite direction through the second half of the U-shaped path and the second half of the heat exchange fins 78. As described earlier, the heat exchange fins 78 provide a large surface area in contact with the flow of air, thereby maximising heat loss as the air passes through the fins. The warmed air is then expelled from the surrounding space at air outlet 86.

In this way, every face of the enclosure cover 22 is subjected to a controlled, cooling flow of air, thereby cooling the electronics enclosure housed within. At the same time, heat is being lost from the electronics enclosure by means of the heat exchange structure 54 mounted on the underside of the base 40. Thus, the present invention advantageously provides positive cooling at each face of the electronics enclosure.

In addition to the flow of air which is caused to circulate around the exterior of the electronics enclosure 22, a circulating air flow is also established within the electronics enclosure by means of stirrer fans 72 and 74. This forms the third flow of air of the cooling system. The rotational axis of the stirrer fans is angled at about 20° to the vertical, so that the fans substantially point towards the inside roof of the electronics enclosure 20. This ensures that cooler air is lifted from the bottom of the electronics enclosure, while imparting a translational velocity to the lifted air. The air is then made to pass between the enclosure cover 22 and the inner cover or guide surface 70, between the internal array of heat exchanger fins 70. The air circulating in the electronics enclosure reaches temperatures that are higher than that of the surrounding enclosure cover. As a result, the circulating air loses heat to the cover and in particular to the internal heat exchange fins 74, cooling the enclosure within. This heat is passed by conduction to the outer surface of the electronics enclosure, and to the external heat exchange fins where some of it is lost to the air. In this way, heat is effectively transferred between the interior and the exterior of electronics enclosure 20. Furthermore, the inner cover or guide surface 70 allows the flow of cold air to be directed preferentially to a particular part of the electronics within the electronics enclosure.

It will be appreciated that although the heat exchange structure provided by the fins is preferred, the metal construction of the enclosure cover means that even if the fins were omitted, the surface would transmit considerable heat to the surrounding space.

Optimum environmental conditions within the electronics enclosure are also ensured by the presence of the breather tube 88. The breather tube is effectively a controlled leak with dimensions carefully chosen to minimise moisture ingress. Air passing through the breather tube between the interior of the electronics enclosure and the exterior of the electronics enclosure, whilst not significantly contributing to heat gain or loss, passes over a desiccant material in the chamber 90 and therefore loses its moisture. Thus, the internal air in the enclosure is kept dry.

As a result of these measures, the high power amplifier is cooled more effectively than known cooling systems, and more efficiently in terms of utilisation of space and resources. It will be appreciated that it is desirable to keep the dimensions of the high power amplifier as small as possible, to make installation, transport and maintenance easy. The preferred cooling system, by using the air efficiently allows the dimensions of the device to remain small.

The size of the HPA is dependent on implementation requirements and desired performance characteristics. The HPA shown in FIG. 1 however is intended to be operable between the temperatures of −40° C. and +50° C. By way of example, the HPA shown has a length of 520 mm, a height of 243 mm and a width of 260 mm, and is designed to withstand altitudes of up to 4.5 km, and incident sunlight up to 1150 W/m$^2$.

The outer cover 4 of the HPA 2 not only cooperates with the enclosure cover 22 to provide an air flow path around the outside of the electronics enclosure 22, it also shields the electronics enclosure from direct sunlight. For this reason it is preferably made of a plastic material so that it is less susceptible to solar heating than, say, a metal cover. Additionally, any heat that is absorbed by the outer cover is partially carried away by the flow of air in between the outer cover and the enclosure cover 22, rather than being imparted directly to the electronics enclosure.

The electronics in the high power amplifier are therefore shielded by three separate covers, the outer cover 6, the enclosure cover 22, and the inner cover 70. Each surface is arranged to facilitate the flow of heat away from the electronics.

A high power-amplifier comprising a cooling system has been described which utilises two high performance axial fans to force the ambient air over an arrangement of finned heat exchangers, one mounted to the TWT, and the other under the power components of the EPC. Air is diverted to circulate continuously over the outside of the electronics enclosure, and is made to separately continuously circulate inside the enclosure. The continuous movement of air also minimises build up of heat caused by solar radiation.

The cooling system described therefore advantageously allows the removal of excess heat from the sealed electronics enclosure within the high power amplifier, as well as protecting against the effects of solar radiation.

Although, air has been described as the principal cooling medium, as this is the only medium reliably available for many field applications, cooling mediums such as different gases or liquids could also be used where appropriate.

Furthermore, in the preferred embodiment described the flow of air has been in a particular direction. It will be appreciated however that the air flow could be arranged to flow in a different directions according to the implementation of the device. For example, the air could be drawn through the surrounding space and the enclosure cover before entering the fans 50 and 52. Additional fans may be necessary to allow for this.

Also, although the preferred embodiment has been described with reference to a high power amplifier, it will be appreciated that the principles of the cooling system could also be applied to any electronic or electrical device that is to be cooled.

The invention claimed is:

1. An electrical apparatus having a cooling system, the apparatus comprising:
   a first cover to cover a first part of the electrical apparatus to be cooled;
   a second cover substantially enclosing the first cover to define a surrounding space there-between, the surrounding space having an inlet and an outlet;

a base plate on which the first cover is mounted to define an environmentally-sealed enclosure that houses the first part of the electrical apparatus to be cooled, the base plate having one or more apertures communicating with the surrounding space;

a first circulation device to cause air to circulate in the environmentally-sealed enclosure;

a second circulation device to cause a cooling fluid to circulate around the surrounding space between the first and second cover adjacent the environmentally-sealed enclosure, wherein the second circulation device is arranged outside of the surrounding space;

a heat transfer structure positioned on each side of the first cover, such that heat is transferred from the environmentally-sealed enclosure to the cooling fluid in the surrounding space and out of the outlet;

a third cover mounted to an opposite side of the base plate from the first cover to define a second enclosure that houses a second part of the electrical apparatus to be cooled; and a heat exchange structure positioned within the second enclosure, wherein the second circulation device is arranged to drive cooling fluid both through the heat exchange structure to draw heat from the second enclosure, and through the surrounding space, via the one or more apertures, to draw heat from the environmentally-sealed enclosure.

2. An electrical apparatus according to claim 1, wherein the base plate and the first cover together define the environmentally sealed enclosure for the first part of the electronic apparatus, and wherein the heat exchange structure is disposed on the base plate outside the environmentally-sealed enclosure in the flow of cooling fluid.

3. An electrical apparatus according to claim 1, wherein the second circulation device comprises one or more fans mounted on the base plate.

4. An electrical apparatus according to claim 1, comprising a restriction in the flow of cooling fluid in the region of the one or more apertures, such that fluid pressure forces cooling fluid through the apertures.

5. An electrical apparatus according to claim 4, wherein the restriction comprises a heat transfer structure.

6. An electrical apparatus according to claim 1, wherein the second part of the electrical apparatus comprises a vacuum tube device.

7. An electrical apparatus according to claim 1, wherein the heat transfer structure comprises a first heat exchanger disposed on the inside of the first cover, within the enclosure.

8. A electrical apparatus according to claim 7 wherein the heat transfer structure further comprises a second heat exchanger disposed on the outside of the first cover, within the surrounding space.

9. An electrical apparatus according to claim 8, wherein the first and second heat exchangers are mounted in correspondence with each other on opposite sides of the first cover.

10. An electrical apparatus according to claim 1, comprising an internal cover mounted in the environmentally-sealed enclosure creating a circulating fluid flow path in the environmentally-sealed enclosure.

11. An electrical apparatus according to claim 10, wherein the first circulation device is mounted on the internal cover.

12. An electrical apparatus according to claim 10, wherein the first cover comprises a heat exchanger on its inside surface, within the environmentally-sealed enclosure, and wherein the internal cover extends in the environmentally-sealed enclosure such that the circulating fluid flow path passes through the heat exchanger.

13. An electrical apparatus according to claim 1, comprising path defining structure disposed in the surrounding space defining a circulating path for the flow of the cooling fluid, between the one or more apertures and the outlet.

14. An electrical apparatus according to claim 13, wherein the path defining device comprises a ridge disposed on the first cover.

15. An electrical apparatus according to claim 3, wherein the path defining structure constrain the cooling fluid to flow substantially over the entirety of the first cover of the environmentally-sealed enclosure.

16. An electrical apparatus according to claim 1, comprising a breather tube housed in the first cover, a chamber in communication with the breather tube and with the environmentally sealed enclosure, and a desiccant material located in the chamber.

17. An electrical apparatus according to claim 1, having a fluid inlet and a fluid outlet in communication with the surrounding space.

18. An electrical apparatus according to claim 1, wherein the cooling fluid is air.

19. An electrical apparatus according to claim 1, wherein the first cover is metal.

20. An electrical apparatus according to claim 1, wherein the second cover is a plastic material.

21. An electrical apparatus according to claim 1, wherein the first and second cover have smoothed corners.

22. An electrical apparatus according to claim 1, wherein the outlet joins the fluid flow path adjacent the environmentally-sealed enclosure.

23. A high power radio frequency amplifier comprising the electrical apparatus of claim 1.

24. A satellite uplink amplifier comprising the electrical apparatus of claim 1.

* * * * *